(12) United States Patent
Salmonson et al.

(10) Patent No.: US 6,434,007 B1
(45) Date of Patent: Aug. 13, 2002

(54) HEAT SINK ATTACHMENT CLIP

(75) Inventors: Richard B. Salmonson, Chippewa Falls; David Paul Gruber, Mondovi, both of WI (US)

(73) Assignee: Silicon Graphics, Inc., Mountain View, CA (US)

( * ) Notice: Subject to any disclaimer, the term of this patent is extended or adjusted under 35 U.S.C. 154(b) by 0 days.

(21) Appl. No.: 09/620,335

(22) Filed: Jul. 20, 2000

(51) Int. Cl.[7] .................................................. H05K 7/20
(52) U.S. Cl. ........................ 361/709; 361/704; 361/707; 257/706; 174/16.3; 165/80.3
(58) Field of Search .................................. 361/702–709, 361/717–720, 712, 713, 722, 690, 689, 728–729; 257/706–727; 165/802–804, 185; 24/458, 472, 625, 477, 456; 248/316.7, 505, 510, 570; 174/15.1, 15.2, 16.3

(56) References Cited

U.S. PATENT DOCUMENTS

| | | | |
|---|---|---|---|
| 3,942,854 A | * 3/1976 | Klein et al. | 339/17 CF |
| 5,329,426 A | * 7/1994 | Villani | 361/719 |
| 5,734,556 A | * 3/1998 | Saneinejad et al. | 361/719 |
| 6,075,700 A | * 6/2000 | Houghton et al. | 361/704 |
| 6,130,821 A | * 10/2000 | Gerber | 361/704 |
| 6,219,241 B1 | * 4/2001 | Jones | 361/704 |

* cited by examiner

*Primary Examiner*—Darren Schuberg
*Assistant Examiner*—Michael Datskovsky
(74) *Attorney, Agent, or Firm*—Schwegman, Lundberg, Woessner & Kluth, P.A.

(57) ABSTRACT

A heat sink assembly for securing a heat sink to a chip on a circuit board using a clip to secure the heat sink to the chip. The assembly includes a pair of support beams, a clip attached to the pair of support beams, and a heat sink. Optionally, the assembly also includes a plurality of bias members biased between the heat sink and the circuit board and a pair of positioning pins positioned between the heat sink and the circuit board. The clip is biased between the heat sink and the pair of support beams.

The clip has a plate having a first end and a second end with the first end having an aperture for fastening the first end to a first support beam and the second end having a hook for fastening the second end to a second support beam. Optionally, the clip is made of spring steel and provides a downward biasing force of between about 3 psi and about 25 psi and preferably about 10 psi.

20 Claims, 3 Drawing Sheets

HEAT SINK ATTACHMENT CLIP

FIELD OF THE INVENTION

The present invention relates to the field of printed circuit boards. More particularly, this invention relates to a clip for securing a heat sink to a chip on a circuit board.

BACKGROUND OF THE INVENTION

Several methods have been used to secure heat sinks to chips on circuit boards. Heat sinks may be attached to a chip by using epoxy. However, epoxy generally has handling problems which can make field use difficult.

Next, the heat sink may be attached to the chip using fasteners that attach to or pass through the circuit board. However, fastening the heat sink directly to the circuit board requires several large fastener holes. These holes may cause trace routing problems, particularly if the fastener holes are located directly between chips on the circuit board.

In addition, chips that are attached to the circuit board by sockets may have the heat sink attached to the socket. However, this is inapplicable if the chip is soldered directly to the printed circuit board.

What is needed is a heat sink attachment that reduces the openings in the printed circuit board without the use of epoxy and that also works for chips that are directly soldered to the printed circuit board.

SUMMARY OF THE INVENTION

One embodiment of the present invention provides a heat sink assembly for securing a heat sink to a chip on a circuit board using a clip to secure the heat sink to the chip. The assembly includes a pair of support beams, a clip attached to the pair of support beams, and a heat sink. Optionally, the assembly also includes a plurality of bias members biased between the heat sink and the circuit board and a pair of positioning pins positioned between the heat sink and the circuit board. The clip is biased between the heat sink and the pair of support beams.

One embodiment of the present invention includes a clip for attaching a heat sink to a circuit board. The clip has a plate having a first end and a second end with the first end having an aperture for fastening the first end to a first support beam and the second end having a hook for fastening the second end to a second support beam. Optionally, the clip is made of spring steel and provides a downward biasing force of between about 3 psi and about 25 psi and preferably about 10 psi.

One embodiment of the present invention includes a method of securing a heat sink to a chip on a circuit board. The method includes providing a clip and a pair of support beams, securing the clip to the support beams, and biasing the clip against the heat sink. Optionally the method may also include positioning the heat sink with a pair of positioning pins located between the heat sink and the circuit board.

DESCRIPTION OF THE PREFERRED EMBODIMENT

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Figure 1:
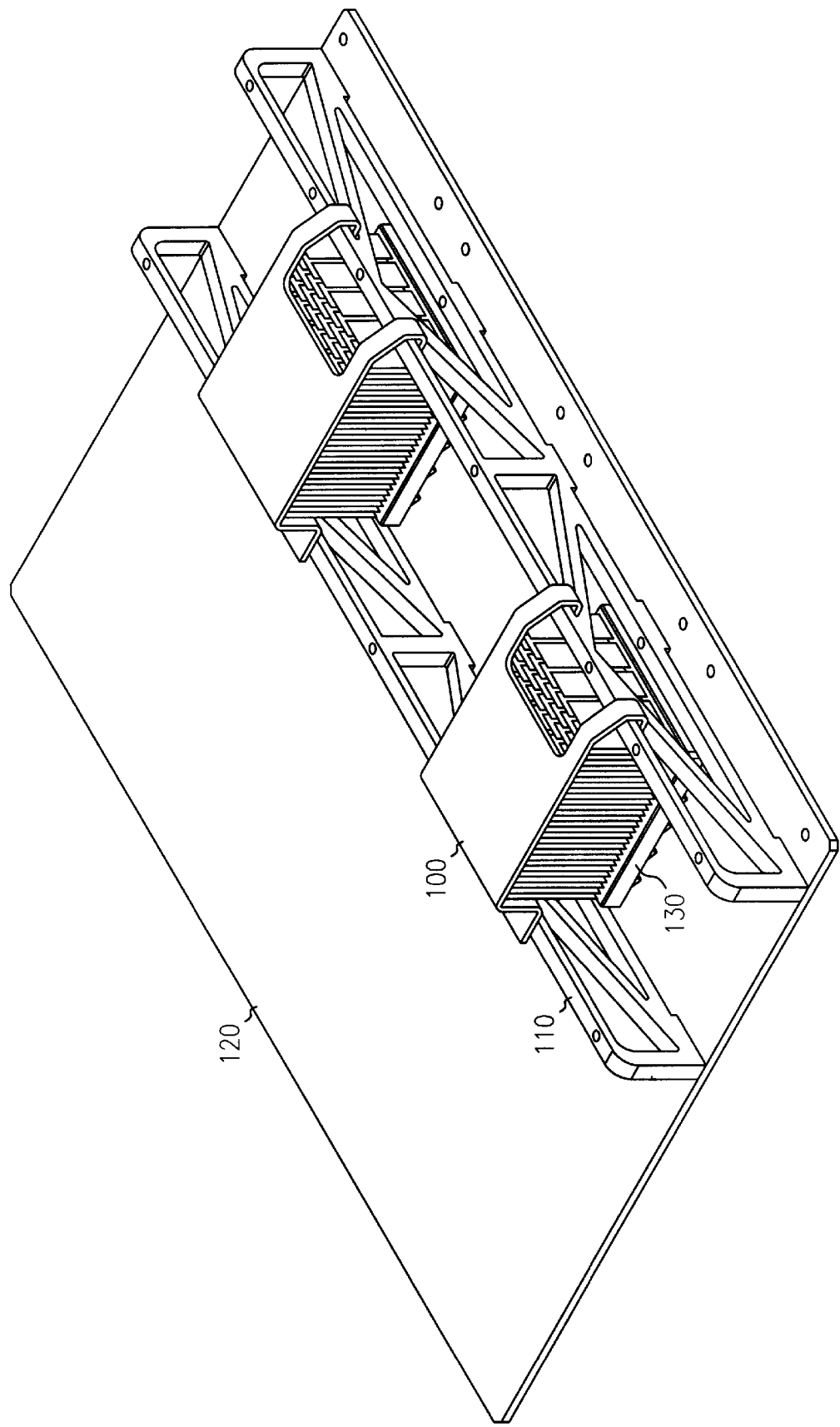
FIG. 1 is a perspective view of a printed circuit board assembly with an embodiment of a clip securing a heat sink to a chip attached to the printed circuit board.

As shown in FIG. 1, a clip 100 attaches to support beams 110. The support beams attach to circuit board 120. The support beams provide a fastening location for the clip 100 as well as structural rigidity to the circuit board 120. The clip 100 secures the heat sink 130 to a chip 140 (See FIG. 2) on the circuit board 120. The clip also provides additional structural rigidity to the circuit board. The support beams are attached to the circuit board with fasteners at locations away from the chip that are not as critical for circuit routing.

Figure 2:
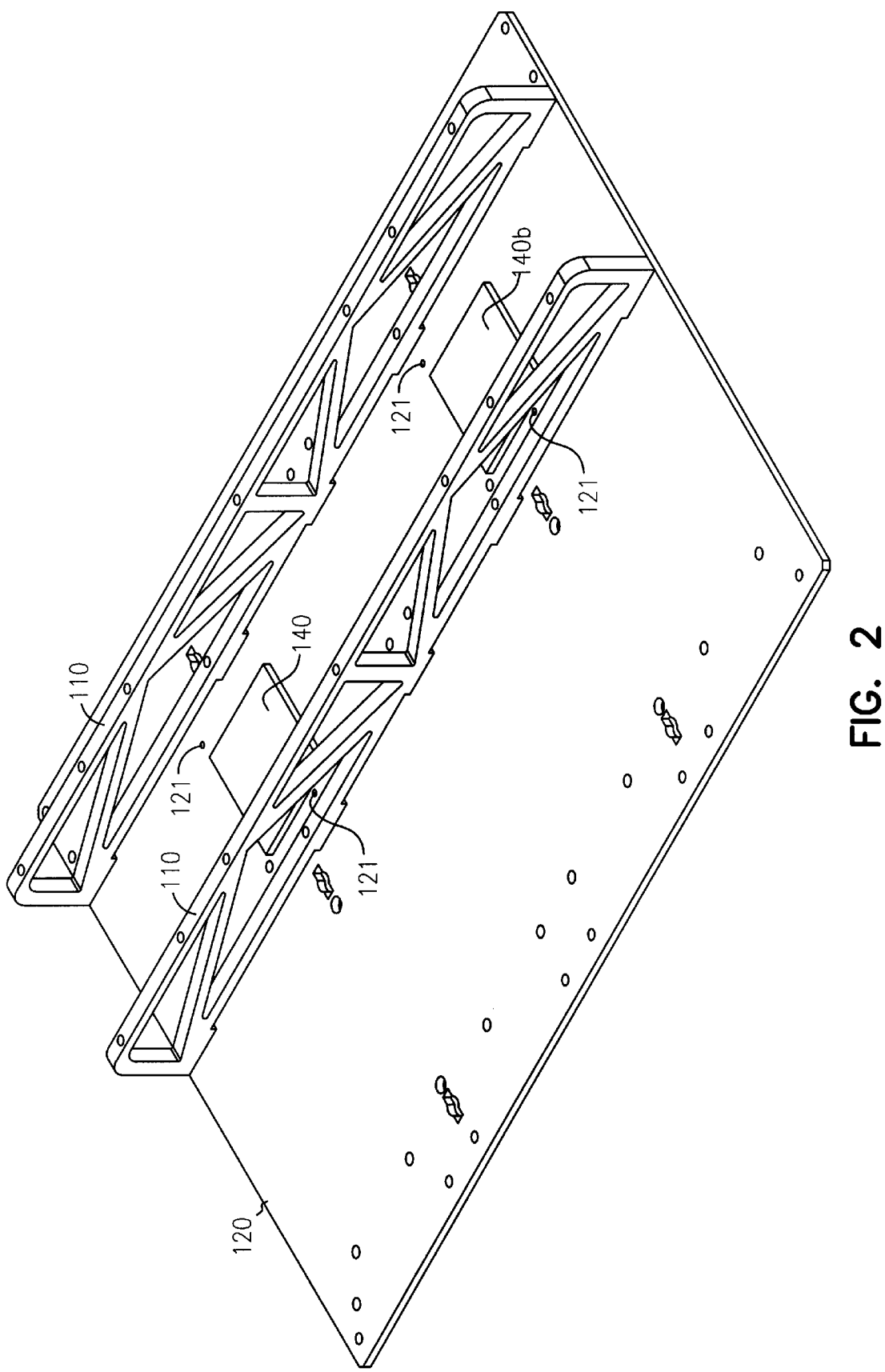
FIG. 2 is perspective view of an embodiment of a printed circuit board assembly showing the assembly with the heat sink removed.

FIG. 2 shows a circuit board 120 with a chip 140 and support beams 110. The circuit board is shown with the heat sink 130 removed. Optionally, the circuit board 120 has a second chip 140b. The circuit board 120 has openings 121 to receive the positioning pins 134 (See FIG. 3) of the heat sink 130.

Figure 3:
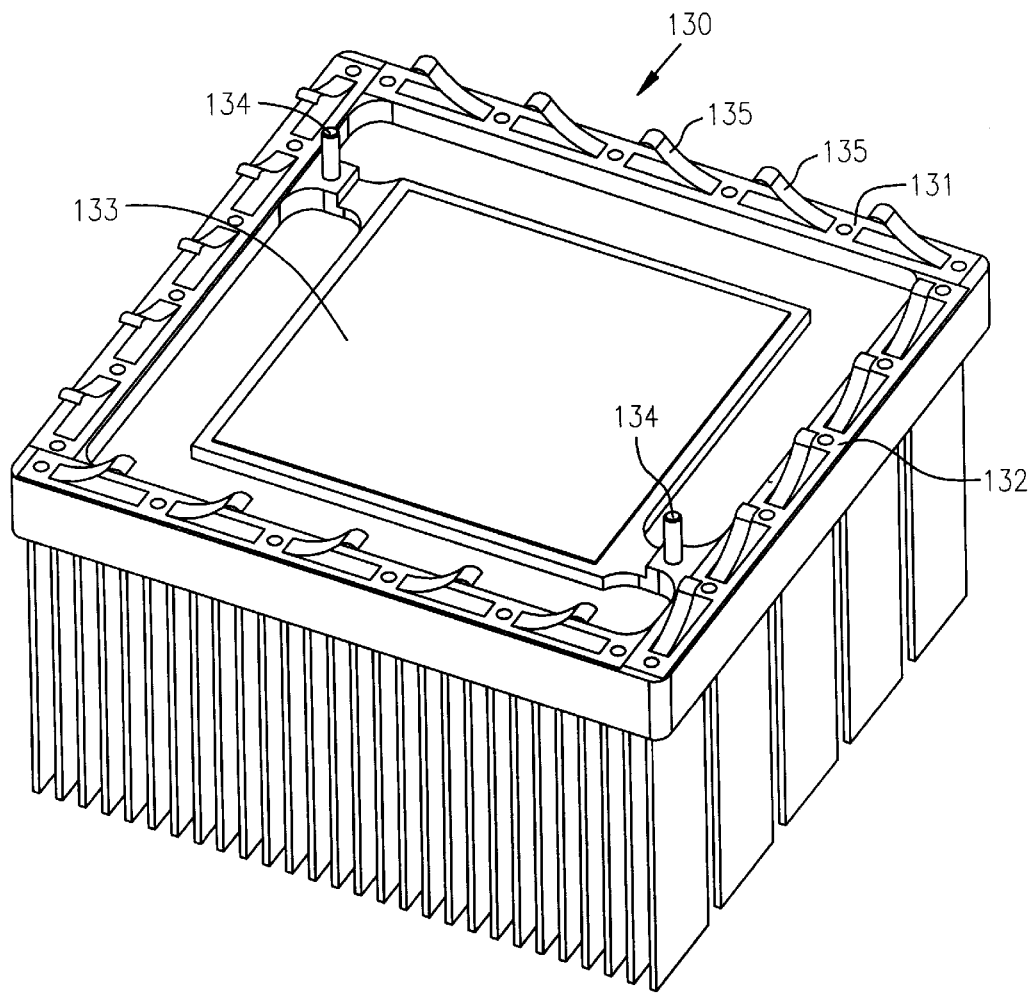
FIG. 3 is a bottom perspective view of one embodiment of the heat sink showing the positioning pins and bias members.

FIG. 3 shows a bottom perspective view of heat sink 130. The heat sink has a bottom surface 131 for contacting the chip 140 and the circuit board 120. (See FIGS. 1 and 2). The bottom surface 131 includes a perimeter portion 132 and a recessed portion 133. The perimeter portion 132 contacts the circuit board 120 and the recessed portion 133 contacts the chip 140. (See FIG. 2). The recessed portion 133 is designed to transmit heat from the chip 140 to the heat sink 130. A pair of positioning pins 134 and a plurality of bias members 135 are located on the perimeter portion 132. The positioning pins 134 are designed to be received in the openings 121 in the circuit board 120. (See FIG. 2). Securing the heat sink 130 with the clip 100 to the support beams allows the positioning pins 134 and openings 121 to be smaller than would be required for fasteners and fastener openings. Secondly, fewer openings are required in the circuit board to secure the heat sink to the circuit board and the openings may be positioned away from critical circuit routing areas such as directly between chip 140 and 140b. The positioning pins minimize the size and number of openings in the circuit board, causing fewer obstructions for circuit layout, particularly between chips.

Figure 4:
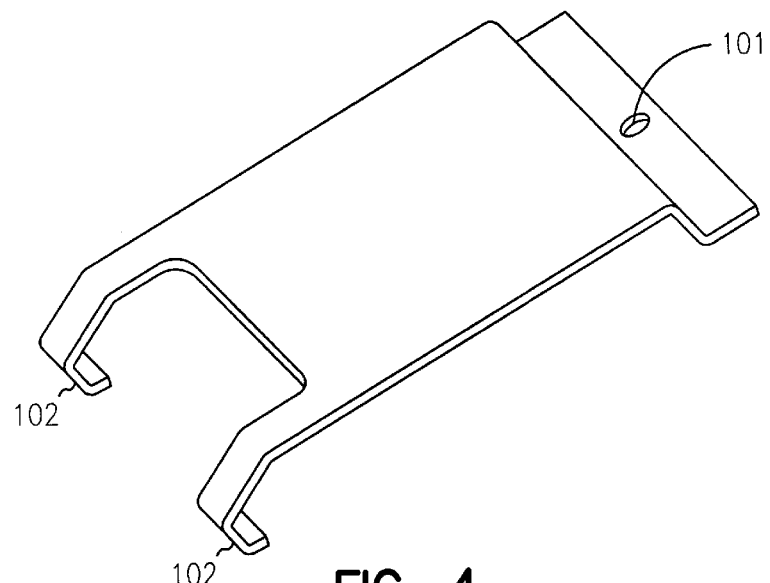
FIG. 4 is a perspective view of one embodiment of the clip.

FIG. 4 shows a perspective view of one embodiment of clip 100. The clip is comprised of spring steel of about 0.031 inches thickness. The clip provides about 5 to about 15 psi, and preferably about 10 psi of downward bias pressure on the heat ink. Less than 2 to 3 psi downward pressure does not provide adequate pressure to secure the heat sink and more than 25 psi may cause damage. The dimensions of the clip may be modified to obtain downward pressure within this range. The clip 100 has at least one hook 102 at one end for attaching to a first support beam an aperture 101 at the other end for connecting to a second support beam. A fastener (not shown) is inserted through the aperture to secure the other end of the clip to the second support beam.

The clip is fastened to the support beams by hooking one end of the clip on one support beam and fastening the other end of the clip to a second support beam by securing the other end with a fastener through the aperture in the clip. The clip is biased against the heat sink and provides downward pressure on the heat sink. The downward pressure secures the heat sink against the chip and secures the positioning pins in the openings in the circuit board.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A heat sink assembly comprising
   a pair of support beams;
   a clip attached to the pair of support beams, wherein the clip includes a first end and a second end, wherein the first end includes an aperture for fastening the first end to one of the pair of support beams and wherein the second end includes a hook for fastening the second end to the other of the pair of support beams; and
   a heat sink for attachment to a chip on a circuit board, wherein the clip secures the heat sink to the chip.

2. The assembly of claim 1 further comprising a plurality of bias members biased between the heat sink and the circuit board.

3. The assembly of claim 1 further comprising a pair of positioning pins positioned between the heat sink and the circuit board.

4. The assembly of claim 1 wherein the clip is biased between the pair of support beams and the heat sink.

5. The assembly of claim 1 further comprising
   a plurality of bias members biased between the heat sink and the circuit board;
   a pair of positioning pins positioned between the heat sink and the circuit board; and
   wherein the clip is biased between the heat sink and the pair of support beams.

6. A clip for attaching a heat sink to a circuit board comprising
   a plate having a first end and a second end;
   the first end having an aperture for fastening the first end to a first support beam;
   the second end having a hook for fastening the second end to a second support beam.

7. The clip of claim 6 wherein the clip comprises spring steel.

8. The clip of claim 6 wherein the clip provides a biasing force of between about 3 psi and about 25 psi.

9. The clip of claim 6 wherein the clip provides a biasing force of between about 5 psi and about 15 psi.

10. The clip of claim 6 wherein the clip provides a biasing force of about 10 psi.

11. A method of securing a heat sink to a chip on a circuit board comprising:
    providing a clip and a pair of support beams, wherein the clip includes a first end and a second end, wherein the first end includes an aperture for a fastener and wherein the second end includes a hook;
    securing the clip to the support beams, wherein securing includes attaching the first end of the clip to one of the pair of support beams with a fastener; and
    biasing the clip against the heat sink, wherein biasing includes hooking the hook to the other of the pair of support beams.

12. The method of claim 11 further comprising positioning the heat sink with a pair of positioning pins located between the heat sink and the circuit board.

13. A heat sink assembly comprising
    a clip attached to a circuit board, wherein the clip includes a first end and a second end, wherein the first end includes an aperture for fastening the first end to the circuit board and wherein the second end includes a hook for fastening the second end to the circuit board;
    a heat sink for attachment to a chip on a circuit board, wherein the clip secures the heat sink to the chip; and
    a pair of positioning pins positioned between the heat sink and the circuit board;
    wherein the heat sink is biased between the clip and the circuit board.

14. The heat sink assembly of claim 13 further comprising
    a plurality of bias members biased between the heat sink and the circuit board.

15. A circuit board assembly, comprising:
    a circuit board;
    first and second support beams attached to the circuit board;
    a heat sink; and
    a clip, wherein the clip includes a first end and a second end, wherein the first end includes an aperture for fastening the first end to the first support beam and wherein the second end includes a hook for fastening the second end to the second support beam;
    wherein the clip is placed so that, when fastened to the first and second support beams, the heat sink is biased between the clip and the circuit board.

16. The assembly of claim 15, wherein the support beams are designed to add structural rigidity to the circuit board.

17. The assembly of claim 16, wherein the support beams serve as handles for the circuit assembly.

18. The assembly of claim 15, wherein the heat sink includes a plurality of bias members biased between the heat sink and the circuit board.

19. A method of securing a heat sink to a chip on a circuit board comprising:
    providing a clip and a pair of support beams, wherein the clip includes a first end and a second end, wherein the first end includes an aperture for a fastener and wherein the second end includes a hook;
    securing the clip to the support beams, wherein securing includes attaching the second end of the clip to one of the pair of support beams with the hook; and
    biasing the clip against the heat sink, wherein biasing includes inserting a fastener through the aperture so as to attach the first end to the other of the pair of support beams.

20. The method of claim 19 further comprising positioning the heat sink with a pair of positioning pins located between the heat sink and the circuit board.

* * * * *